United States Patent [19]

Mells

[11] Patent Number: 5,717,708
[45] Date of Patent: Feb. 10, 1998

[54] METHOD AND APPARATUS OF STABILIZING A SEMICONDUCTOR LASER

[76] Inventor: Bradley Mells, 2195 Faraday Ave. Suite K, Carlsbad, Calif. 92008

[21] Appl. No.: 556,040

[22] Filed: Nov. 9, 1995

[51] Int. Cl.⁶ ........................................... H01S 3/13
[52] U.S. Cl. .............................. 372/32; 372/26; 372/38
[58] Field of Search ........................... 372/32, 38, 28; 359/124, 152, 154, 156, 160, 172, 173, 187, 189, 190, 191, 192, 194, 900; 356/349, 352

[56] References Cited

U.S. PATENT DOCUMENTS

| | | | |
|---|---|---|---|
| 4,578,793 | 3/1986 | Kane et al. | 372/94 |
| 4,896,327 | 1/1990 | Ebberg | 372/32 |
| 4,912,526 | 3/1990 | Iwaoka et al. | 455/612 |
| 4,929,080 | 5/1990 | Burstyn | 356/338 |
| 4,959,540 | 9/1990 | Fan et al. | 250/227.12 |
| 5,001,720 | 3/1991 | Ackerman et al. | 372/50 |
| 5,007,106 | 4/1991 | Kahn et al. | 455/619 |
| 5,042,086 | 8/1991 | Cole et al. | 455/606 |
| 5,042,922 | 8/1991 | Pepper | 359/72 |
| 5,060,233 | 10/1991 | Harder et al. | 372/22 |
| 5,090,795 | 2/1992 | O'Meara et al. | 359/240 |
| 5,134,624 | 7/1992 | Ono | 372/32 |
| 5,208,819 | 5/1993 | Huber | 372/32 |
| 5,247,382 | 9/1993 | Suzuki | 359/156 |
| 5,317,382 | 5/1994 | Miyazaki et al. | 356/351 |
| 5,347,525 | 9/1994 | Faris | 372/32 |
| 5,365,361 | 11/1994 | Noll et al. | 359/161 |
| 5,367,396 | 11/1994 | Sotom et al. | 359/124 |
| 5,383,210 | 1/1995 | Ichikawa | 372/38 |
| 5,396,361 | 3/1995 | Sasaki et al. | 359/189 |
| 5,408,349 | 4/1995 | Tsushima et al. | 359/187 |
| 5,422,752 | 6/1995 | Hardcastle | 359/183 |
| 5,548,434 | 8/1996 | Shimonaka et al. | 359/152 |

OTHER PUBLICATIONS

MacFarlane et al., Optimization of gain switched diode lasers for high speed fiber optics, 1365 SPIE Components for Fiber Optic Applications V 88 (1990). no month.

Yonetani et al., Transmission Characteristics of DFB Laser Modules for Analog Applications, 11(1) Journal of Lightwave Technology 147 (Jan., 1993).

Bair et al., Demonstration of Frequency Control and CW Diode Laser Injection Control of a Titanium–Doped Sapphire Ring Laser with No Internal Optical Elements, 24(6) IEEE Journal of Quantum Electronics 1045 (Jun., 1988).

Blauvelt et al., Optimum Range for DFB Laser Chirp for Fiber–Optic AM Video Transmission, 11(1) Journal of Lightwave Technology 55 (Jan., 1993).

Davis et al., Reflective fiber ring resonator with polarization–independent operation, 18(9) Optics Letters 750 (May 1, 1993).

Pandian et al., Analysis of a fibre–optic ring resonator with polarization sensing with improved sensitivity, 39(5) Journal of Modern Optics 991 (1992).

Fabre et al., Ultrahigh–finesse optical cavities, 11(6) Optics Letters 365 (Jun., 1996).

Veltrop et al., Modified Tables for the Design of Optimum Diplexers, The Microwave Journal 76 (Jun., 1964).

(List continued on next page.)

*Primary Examiner*—Rodney B. Bovernick
*Assistant Examiner*—Robert E. Wise
*Attorney, Agent, or Firm*—Welsh & Katz, Ltd.

[57] ABSTRACT

A method of frequency stabilizing a semiconductor laser. The method includes the steps of detecting a heterodyne beat note by optically mixing a leakage field of an optical resonator and a frequency modulated output of the semiconductor laser and detecting a phase of the heterodyne beat note by mixing the heterodyne beat note in quadrature with a radio frequency reference signal. The method further includes the steps of filtering the detected phase of the heterodyne beat note, scaling the filtered detected phase of the heterodyne beat note, and modulating the semiconductor laser with the scaled detected phase of the heterodyne beat note and the radio frequency modulation reference signal.

14 Claims, 4 Drawing Sheets

OTHER PUBLICATIONS

Shi et al., Bias of a Resonator Fiber Optic Gyro Composed of a Polarization–Maintaining Fiber Ring Resonator with the Photoinduced Birefringent Grating, paper presented at proceedings of IEEE (May 10–12, 1994).

Takahashi et al., Effect of Reflections on the Drift Characteristics of a Fiber–Optic Passive Ring–Resonator Gyroscope, 8(5) Journal of Lightwave Technology 811 (May, 1990).

Ford et al., Narrow–band, wavelength–division multiplexers using birefringent optical fibre, 98 Optics Communications 151 (1993). no month.

Yamazaki et al., A Coherent FDM CATV Distribution System, 8(3) Journal of Lightwave Technology 396 (Mar. 1990).

Kazovsky et al., Sensitivity Penalty in Multichannel Coherent Optical Communications, 6(9) Journal of Lightwave Technology 1353 (Sep., 1988).

Haus et al., Comments on "Noise in Photoelectric Mixing", Proceedings of the IRE 1544 (Jun., 1962).

Debney et al., Coherent Analog Fiber Optic Links, 995 SPIE High Frequency Analog Communications 99 (1988). no month.

Day et al., Demonstration of a Low Bandwidth 1.06 μm Optical Phase–Locked Loop for Coherent Homodyne Communication, 2(4) IEEE Photonics Technology Letters 294 (Apr., 1990).

Fujiwara et al., A Coherent Photonic Wavelength–Division Switching System for Broad–Band Networks, 8(3) Journal of Lightwave Technology 416 (Mar., 1990).

Gross et al., Multichannel Coherent FSK Experiments Using Subcarrier Multiplexing Techniques, 8(3) Journal of Lightwave Technology 406 (Mar., 1990).

Brain et al., Progress Towards the Field Deployment of Coherent Optical Fiber Systems, 8(3) Journal of Lightwave Technology 423 (Mar., 1990).

Cimini, Optical Phase Division Multiplexing for Local Communications Applications, 37(12) IEEE Transactions on Communications 1282 (Dec., 1989).

Garrett et al., The Effect of Laser Linewidth on Coherent Optical Receivers with Nonsynchronous Demodulation, LT–5(4) Journal of Lightwave Technology 551 (Apr., 1987).

Garrett et al., Theoretical Analysis of Heterodyne Optical Receivers for Transmission Systems Using (Semiconductor) Lasers with Nonnegligible Linewidth, LT–4(3) Journal of Lightwave Technology 323 (Mar., 1986).

Gimlett et al., A 2–Gbit/s Optical FSK Heterodyne Transmission Experiment Using a 1520–nm DFB Laser Transmitter, LT–5(9) Journal of Lightwave Technology 1315 (Sep., 1987).

Vodhanel et al., FSK Heterodyne Transmission Experiments at 560 Mbit/s and 1 Gbit/s, LT–5(4) Journal of Lightwave Technology 461 (Apr., 1987).

Bode, Feedback—The History of an Idea, paper presented at the Symposium on Active Networks and Feedback Systems (Apr. 19–21, 1960).

Brittain, Black on Negative Feedback Amplifiers, 72(6) Proceedings of the IEEE 715 (Jun., 1984).

Ohtsu et al., FM Noise Reduction and Subkilohertz Linewidth of an AlGaAs Laser by Negative Electrical Feedback, 26(2) IEEE Journal of Quantum Electronics 231 (Feb., 1990).

Nakagawa et al., Frequency noise reduction of a diode laser using the FM sideband technique, 17(13) Optics Letters 934 (Jul. 1, 1992).

Kourogi et al., A 134 Mhz Bandwidth Homodyne Optical Phase–Locked–Loop of Semiconductor Laser Diodes, 3(3) IEEE Photonics Technology Letters 270 (Mar., 1991).

Hansch et al., Laser Frequency Stabilization by Polarization Spectroscopy of a Reflecting Reference Cavity, 35(3) Optics Communications 441 (Dec., 1980).

Fleming et al., Spectral Characteristics of External–Cavity Controlled Semiconductor Lasers, 17(1) IEEE Journal of Quantum Electronics 44 (Jan., 1981).

DeVoe et al., Laser–frequency division and stabilization, 30(5) Physical Review A 2827 (Nov., 1984).

Schenzle et al., Phase–modulation laser spectroscopy, 25(5) Physical Review A 2606 (May, 1982).

Yamaguchi et al., Frequency stabilization of a diode laser by use of the optogalvanic effect, 41(7) Appl. Phys. Lett. 597 (Oct. 1, 1982).

Ohtsu et al., Linewidth Reduction of a Semiconductor Laser by Electrical Feedback, 21(12) IEEE Journal of Quantum Electronics 1905 (Dec., 1985).

Boyd et al., Frequency stabilization of a continuous–wave Ti:sapphire laser, 16(11) Optics Letters 808 (Jun. 1, 1991).

Koch et al., Semiconductor Laser for Coherent Optical Fiber Communications, 8(3) Journal of Lightwave Technology 274 (Mar., 1990).

Drever et al., Laser Phase and Frequency Stabilization Using an Optical Resonator, 31 Appl. Phys. B 97 (1983). No Month.

Paul et al., Narrow–linewidth diode laser using a fiber–optic ring resonator, 18(15) Optics Letters 1241 (Aug. 1, 1993).

Kalli et al., Ring resonator optical spectrum analyzer with 20–Khz resolution, 17(15) Optics Letters 1090 (Aug. 1, 1992).

METHOD AND APPARATUS OF STABILIZING A SEMICONDUCTOR LASER

FIELD OF THE INVENTION

The field of the invention relates to lasers and, more particularly, to frequency stabilized lasers.

BACKGROUND OF THE INVENTION

Methods of providing overall frequency control of lasers are known. Optical phase locked loops (OPLLs) are also known. Such techniques have been applied to a variety of lasers including gas lasers, dye lasers and solid state lasers to achieve frequency stabilization and linewidth narrowing performance under appropriate laboratory conditions. Linewidth, as such term is used in the art, refers to the overall spectral content of the laser output (i.e., a frequency spectrum), rather than any resolution limitation (e.g., lines/mm) of the optical system.

The prior use of OPLLs has generally been limited to systems including laser resonators wherein the spectral response is characterized by a single frequency of relatively narrow linewidth. Thus in the OPLL of the prior art the transfer function of the optical system comprising the laser resonator typically must provide adequate filtering to select an individual spectral feature for amplification while reducing the Fourier frequencies at which residual laser phase noise may occur. On the other hand, the wide free running linewidths characteristic of monolithic semiconductor lasers has made feedback control of these devices substantially more difficult. Thus the vast majority of researchers have abandoned the monolithic design in order to reduce the free spectral range of the semiconductor laser resonator.

Key to the teachings of the prior art has been a belief that the active device comprising the laser resonator must exhibit a high degree of coherence. Thus as the free spectral range of the optical resonator is increased, the resonance bandwidth must be correspondingly reduced in order to provide adequate phase stability for the implementation of the OPLL of the prior art. This can be accomplished in some cases by further increasing the resonator finesse or by utilizing a laser gain medium wherein the energy state from which emission is stimulated is adequately metastable to produce the required phase noise quieting.

Stabilization of a laser is typically achieved by directing a portion of a laser output signal into a passive optical resonator which resonates at a particularly defined series of frequencies independent of the laser frequency, and the laser frequency is maintained on one such resonant frequency through feedback control action. When the reflectivities of the mirrors comprising the resonator are very high (low loss), the resonator is referred to as a high finesse resonator. Mathematically the finesse is simply the free spectral range of the resonator divided by its full width at half maximum frequency response (spectral linewidth). It is the free spectral range of the resonator which determines the spectral linewidth for a given finesse. The high finesse resonator which also exhibits long term stability properties has been suggested to be an important factor in the control and stabilization of lasers.

Accordingly it is an objective of this invention to provide a laser stabilization control system that is applicable to semiconductor lasers.

It is further objective of this invention to provide a feedback control system which is compatible with high finesse resonators but is not dependent upon them.

It is further objective of this invention to achieve narrow linewidth as well as long term frequency stable operation of the semiconductor laser.

SUMMARY OF THE INVENTION

These and other objectives are provided by a disclosed method of frequency stabilizing a semiconductor laser wherein a laser phase is detected relative to a resonator phase (or another optical reference signal phase) and fed back as a frequency control signal to the laser. The method includes the steps of detecting a microwave signature of the laser spectrum in a heterodyne beat note by optically mixing a leakage field of an optical resonator and a frequency modulated output of the semiconductor laser in a photodiode, and detecting a phase of the laser by mixing the resulting microwave spectrum tuned to an appropriate phase relationship with a frequency modulation reference source. The method further includes the steps of filtering the detected phase of the heterodyne spectrum, scaling the detected phase of the heterodyne spectrum, and modulating the semiconductor laser with the frequency modulation reference source and the scaled detected phase of the heterodyne spectrum.

DETAILED DESCRIPTION OF A PREFERRED EMBODIMENT

Figure 1:
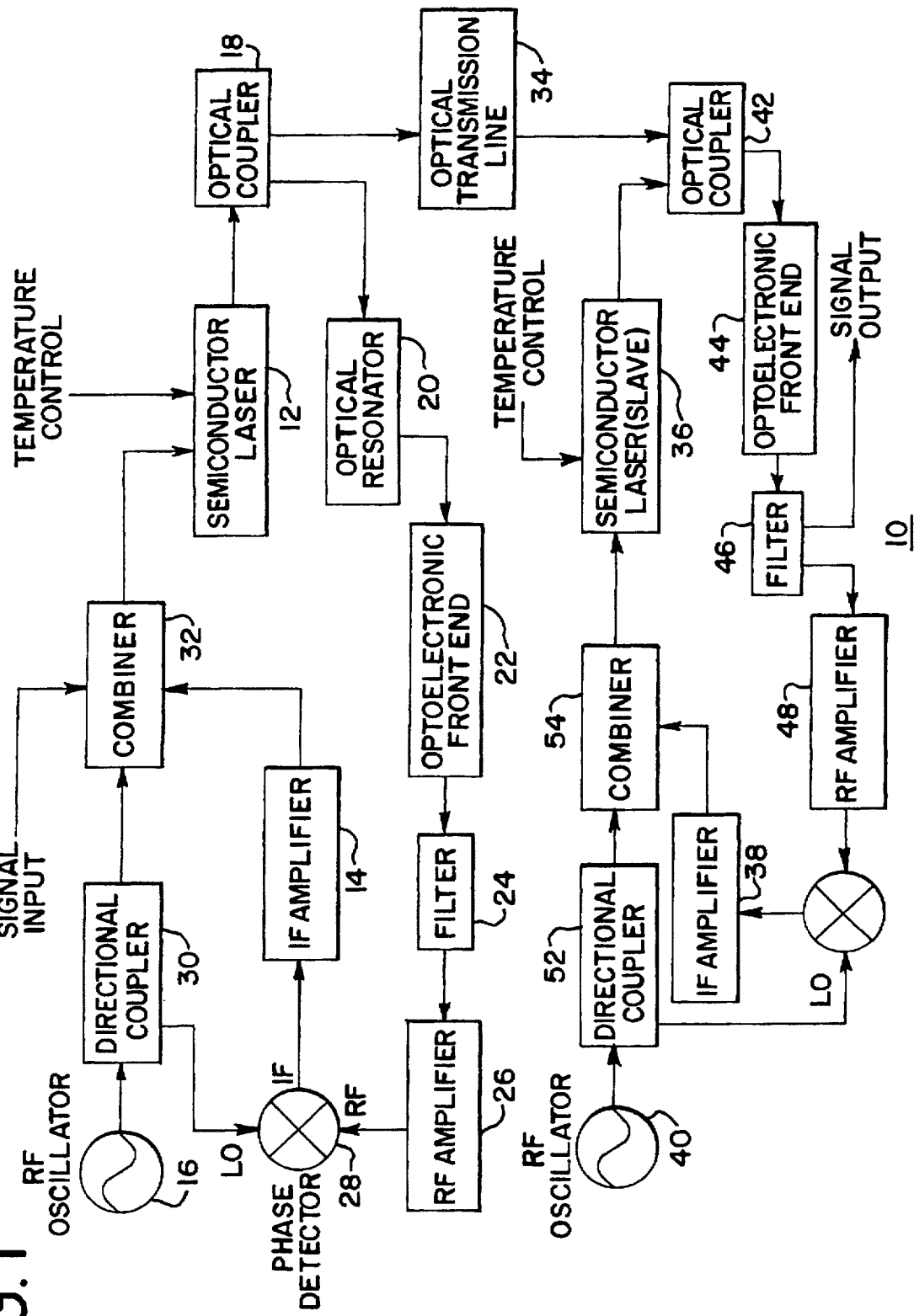
FIG. 1 depicts a block diagram of a semiconductor laser stabilization system of a coherent optical communications transceiver in accordance with a preferred embodiment of the invention.

FIG. 1 shows a block diagram of a laser stabilization control system 10, generally, under an embodiment of the invention. As shown, a semiconductor laser 12 is modulated by an IF amplifier 14, a microwave (RF) oscillator 16 and a signal input. Whereas the semiconductor laser 12 represented by FIG. 1 may be an InGaAsP distributed feedback laser (e.g., model 257 made by AT&T), it is understood that the invention is applicable to any conventional laser including but not limited to index guided lasers and other types of buried heterostructure designs. In fact, the invention has been demonstrated to work well on GaAlAs lasers as well as InGaAsP lasers.

Modulating the laser 12 by a signal from the RF oscillator 16 causes the laser phase to be modulated at the frequency of the RF oscillator 16. Stabilization of the laser 12 may then be accomplished as described below by a feedback signal combined with the signal from the RF oscillator 16 within the combiner 32.

Under the embodiment, the optical coupler 18 includes an optical element of an appropriate coupling ratio. The optical coupler 18 functions as a beamsplitter or partial reflector so that as laser emissions strike the optical element, some of the light is transmitted through the optical element and some of the light is reflected from it. That portion which is transmitted through the optical coupler 18 is useful as a communications signal and that which is coupled or reflected is directed toward the optical resonator 20 for use as a feedback signal. The optical coupler 18 may be a mirror with a suitable optical coating or a passive fiber optic device with a suitable coupling ratio.

Figure 2:
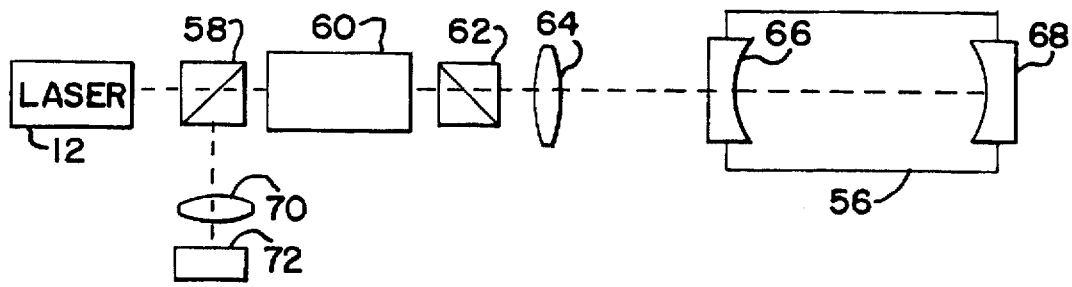
FIG. 2 illustrates an embodiment of the optical resonator 20 utilizing a Fabry-Perot interferometer as a reference cavity in the transceiver of FIG. 1.
Figure 3:
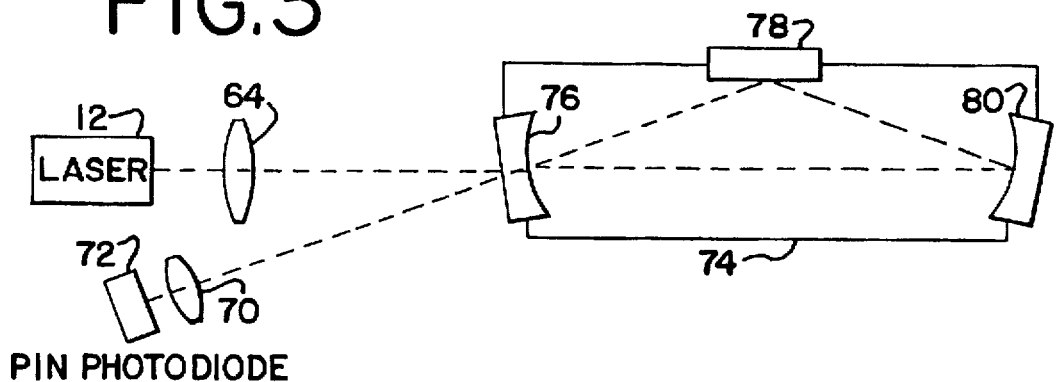
FIG. 3 illustrates an embodiment of the optical resonator 20 utilizing a three element ring resonator as a reference cavity in the transceiver of FIG. 1.
Figure 4:
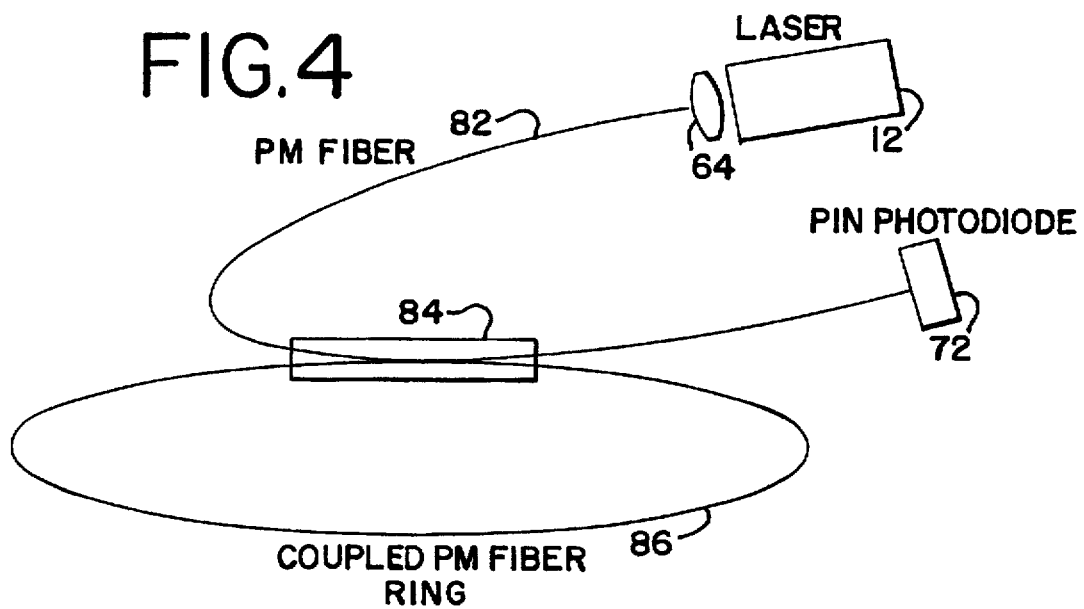
FIG. 4 illustrates an embodiment of the optical resonator 20 utilizing a polarization maintaining fiber ring resonator as a reference cavity in the transceiver of FIG. 1.

The optical resonator 20 may be a Fabry-Perot interferometer 56 or a ring resonator 74 configuration, as shown in FIG. 2 and FIG. 3 respectively. FIG. 4 represents a preferred embodiment in which a fiber optic ring resonator 86 is utilized. For the purposes of this invention, the optical ring coupler 84 between the input fiber 82 and the fiber optic ring 86 functions in a manner analogous to the input mirror 66 of a Fabry-Perot interferometer 56. The behavior of the resonant modes of the fiber optic ring resonator 86 is quite similar to that of the longitudinal modes in a ring resonator 74.

In the embodiment depicted by FIG. 2 where a Fabry-Perot interferometer 56 is utilized, it is often desirable and sometimes imperative that a high degree of isolation be maintained between the optical resonator 56 and the semiconductor laser 12. In the embodiment, said isolation is accomplished by a Farady rotator 60 in combination with input 58 and output 62 polarizing optics. The input polarizing optic 58 also performs the function of a polarization selective beamsplitter which directs a strong feedback signal to the photodiode 72 comprising the input to the optoelectronic front end 22, while providing the required isolation from the semiconductor laser 12.

On the other hand, in the embodiment of the invention (FIG. 3) which utilizes a ring resonator 74 the input mirror 76 is titled off-axis; thus this design provides inherent isolation between the optical resonator 74 and the semiconductor laser 12 because the reflection from the input mirror 76 is aligned to the PIN photodiode 72 instead of the laser 12. Thus, in addition to providing isolation of the resonator 74 from the laser 12, the input mirror 76 of the ring cavity 74 performs the secondary function of beamsplitter for the feedback signal.

In order to ensure that resonant power can be established in the optical resonator 20, one must match the spatial characteristics of the laser beam to the desired spatial mode of the optical resonator 20. This can usually be accomplished with a mode matching lens 64.

While Fabry-Perot resonators 56 and ring resonators 74, 86 are useful in frequency selection, they are difficult to design and build, especially in the high finesse range (e.g., 50,000–100,000). Optical reflecting devices having tolerances of fractions of a thousandth of a millimeter are required. Optical coatings for ultra-high reflectivity mirrors with losses not exceeding a few parts per million are also required. Precise alignment are often difficult to maintain over extended periods of time in the harsh and rugged environments typical of the field application.

In a preferred embodiment such as that depicted in FIG. 4, the bulk optics 76, 78, 80 of the ring resonator 74 of FIG. 3 are replaced with fiber optic elements 82, 84, 86. In this case, an optical coupler device 84 replaces the input mirror 76 of FIG. 3. The other optical elements 78, 80 which form the ring resonator 74 in FIG. 3 are replaced by a loop of polarization maintaining (PM) fiber 86. To realize the embodiment in the manner depicted in FIG. 4, it is important to provide a low loss interface inside the ring coupler 84 between the input PM fiber 82 and the fiber optic ring resonator 86. Note that any losses in the fiber optic ring coupling device 84 or the fiber optic ring 86 will degrade the resonator finesse. Thus the optical ring coupler 84 which is utilized must provide a relatively low coupling ratio (e.g., <1%) between the coupled PM fibers with minimal excess loss. Typically the excess loss must be considerably smaller than the coupling ratio in order to achieve optimal results.

Regarding the application of the polarization maintaining fiber optic ring 86 to the optical resonator 20 some final notes are in order. In order to achieve a working assembly, it is important to ensure that a uniform linear polarization is introduced into the input of the polarization maintaining fiber 82 coupled to the fiber optic resonator 86. One may ensure this by inserting a polarizing optical element 64 between the laser output and the PM fiber input and by aligning the orientation of the transmitted polarization to correspond to a principal axis of the PM fiber (i.e., the fast or slow axis) which will thus maintain the integrity of the optical polarization as it propagates along the PM fiber.

Furthermore, one must ensure that the splice which connects the two ends of the polarization maintaining fiber forming the ring resonator 86 also be of high polarization maintaining integrity. This can be accomplished by utilizing a high quality polarization maintaining fusion splicer (e.g., Alcoa-Fujikura model FSM-20PMII) to splice together the two ends of the PM fiber which forms the ring resonator 86. Provided that one follows this approach, the assembly of a stable optical resonator suitable for practicing this aspect of the invention becomes relatively straightforward).

As described above, the optical resonator 20 may be a fiber optics device (e.g., coupled PM fiber ring 86) or a bulk optics device (e.g., Fabry-Perot interferometer 56). The optical resonator 20 may be constructed to resonate at an appropriate laser frequency (e.g., 230 THz) and at an appropriate finesse (e.g., 200) using commercially available optical components. While a much higher finesse (e.g., 80,000) may be achieved by using research grade optical components and may function particularly well, it is contemplated that the invention would be most beneficial and cost effective when applied to resonators with lower finesse (e.g., less than 1000).

The optoelectronic front end 22 interfaces to the optical resonator 20 of the optical system through an appropriate high speed photodetector. Under the embodiment a PIN photodiode 72 (e.g., EPITAXX model ETX 60B) is selected. Under a preferred embodiment, a transimpedance amplifier (FIG. 5) which provides gain across the full communications system bandwidth (e.g., 10 MHz–2.5 GHz) is utilized to amplify the output from the PIN photodiode 72.

Figure 5:
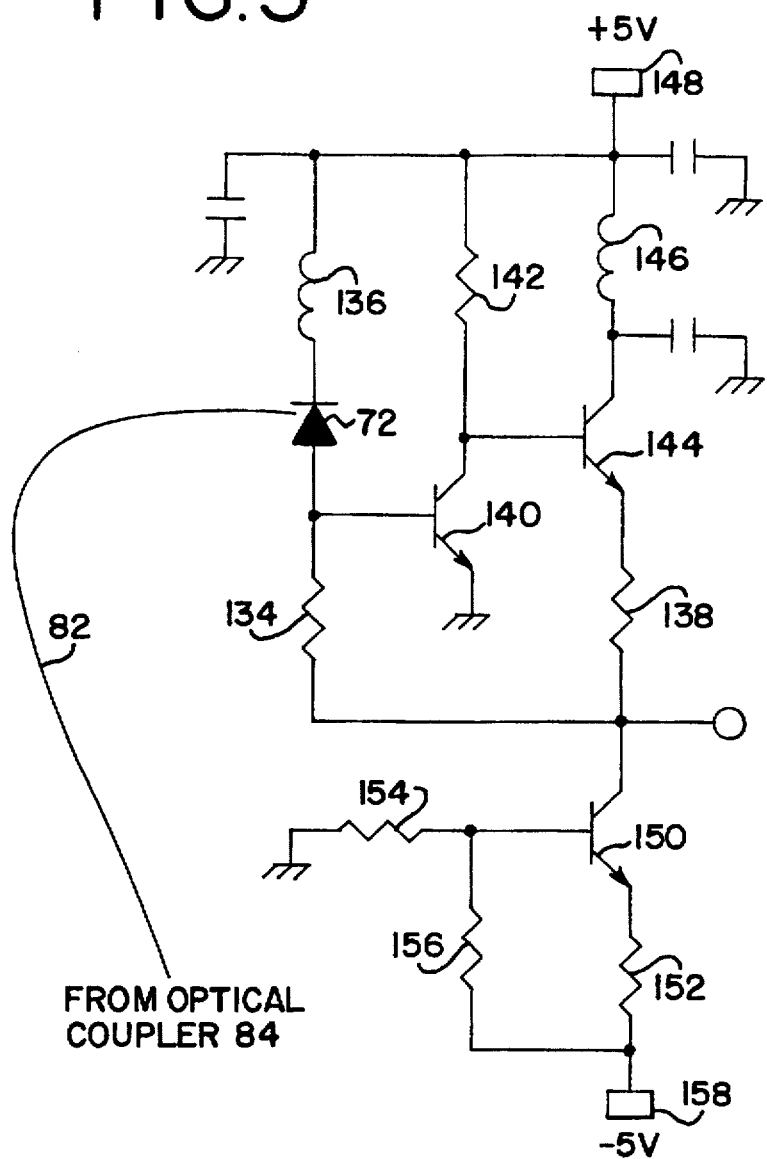
FIG. 5 is a schematic diagram representing the circuitry comprising the optoelectronic front end 22 in an embodiment which produces a flat frequency response from DC-2.5 GHz in the transceiver of FIG. 1.

FIG. 5 depicts a schematic diagram representing an embodiment of the optoelectronic front end 22. In the embodiment the optical signal contained in optical fiber 82 is incident upon PIN photodiode 72 which is connected to the input of a transimpedance amplifier including a common emitter amplifier transistor 140, emitter follower transistor 144, transimpedance resistor 134 and voltage dropping resistor 138. Current source transistor 150 regulates the voltage drop across resistor 152 at one diode junction potential below the base voltage set by a voltage divider comprising resistors 154 and 156, thereby regulating the current through voltage dropping resistor 138. Provided that the maximum current which flows through transimpedance resistor 134 (i.e., signal current) is much smaller than that which regulates the voltage drop across resistor 138, any errors in the bias conditions will be small over the entire dynamic range of the amplifier.

The filter 24 which follows the optoelectronic front end 22 is designed to attenuate any response of the feedback system to the modulation produced by the communications signal (i.e., signal input), while passing the modulation due to RF oscillator 16. Under the embodiment a high pass filter is utilized which achieves <1.0 dB insertion loss at 1.2 GHz while providing >65 dB of attenuation at 800 MHz (e.g., inverted Tchebycheff filter: 4 poles and 4 zeros in passband).

The RF amplifier 26 which follows is a cascade of conventional broadband devices (e.g., Avantek AWT-2054) as are the phase detector 28 (e.g., Watkins-Johnson M2GC) and directional coupler 30 (e.g., Narda 4012C-10). The most unique aspect of the RF amplifier is that the gain is set rather high (e.g., >90 dB) so that the average power contained in the feedback signal to the phase detector 28 at the RF oscillator 16 frequency is brought to a level which saturates the diodes in the phase detector 28 yet not so high as to degrade the signal to noise ratio achieved by the optoelectronic front end 22. Note that the phase detector 28 may be a double balanced mixer in which case one must ensure that the IF port is DC-coupled so that the device will function as a phase detector 28.

The operation of the phase detector 28 is critical to the correct function of the control system. The signal which drives the RF input to the phase detector 28 contains the power spectral density of the laser phase. In the case of the laser transmitter 10 described herein that signal is generated by difference frequency generation produced by optical mixing of the laser 12 with a resonant optical field of the optical resonator 20. Said mixing takes place in the PIN photodiode 72.

Keeping in mind that the laser 12 is phase modulated by RF oscillator 16, it is clear that the RF difference frequency generated in the feedback loop at the frequency of RF oscillator 16 is due to optical mixing of a phase modulation component of the frequency spectrum of laser 12 with a leakage field component which has been spectrally filtered by the optical resonator 20. Because the frequency spectrum of the spectrally filtered component from optical resonator 20 is much narrower than the raw output of semiconductor laser 12, the spectrally filtered signal is capable of resolving much of the fine structure in the laser frequency spectrum into a feedback signal within the PIN photodiode 72. This spectrum appears in the modulation of the photocurrent produced in PIN photodiode 72 at the frequency of the RF oscillator as a heterodyne beat note.

Thus the phase of the laser is contained in the phase of the RF feedback signal. The phase detector 28 subsequently detects the phase of the RF signal, thereby detecting the phase of the laser. The phase of the laser, which is contained in the heterodyne beat note, is detected in the phase detector 28 by mixing the heterodyne beat note in quadrature with a reference signal from the RF oscillator 16.

It is the function of the phase detector 28 to convert the detected phase into a dc coupled error signal of appropriate polarity to cause a phase correction at the servo actuator (i.e., laser 12). The DC characteristics of the IF output of the phase detector 28 are determined by the phase relationship between the signals at the LO and RF ports. Thus this phase relationship must be adjusted in order to produce the appropriate IF response. This adjustment can be made by tuning the frequency of the RF oscillator 16 or by changing the physical length of a delay line between directional coupler 30 and the LO input to the phase detector 28.

When the phase relationship between the LO and RF input signals to the phase detector 28 have been properly adjusted, the IF signal has a distinct bipolar shape corresponding to laser frequencies in the vicinity of a resonance mode of the optical resonator 20. Thus if a phase error occurs which drives the laser to a higher frequency a corresponding change in the IF signal will cause the laser junction current to increase until the laser 12 phase corresponds to that of the optical resonator 20. Conversely, the IF signal will cause junction current to be reduced if a phase error results in a lower frequency laser emission.

Figure 6:
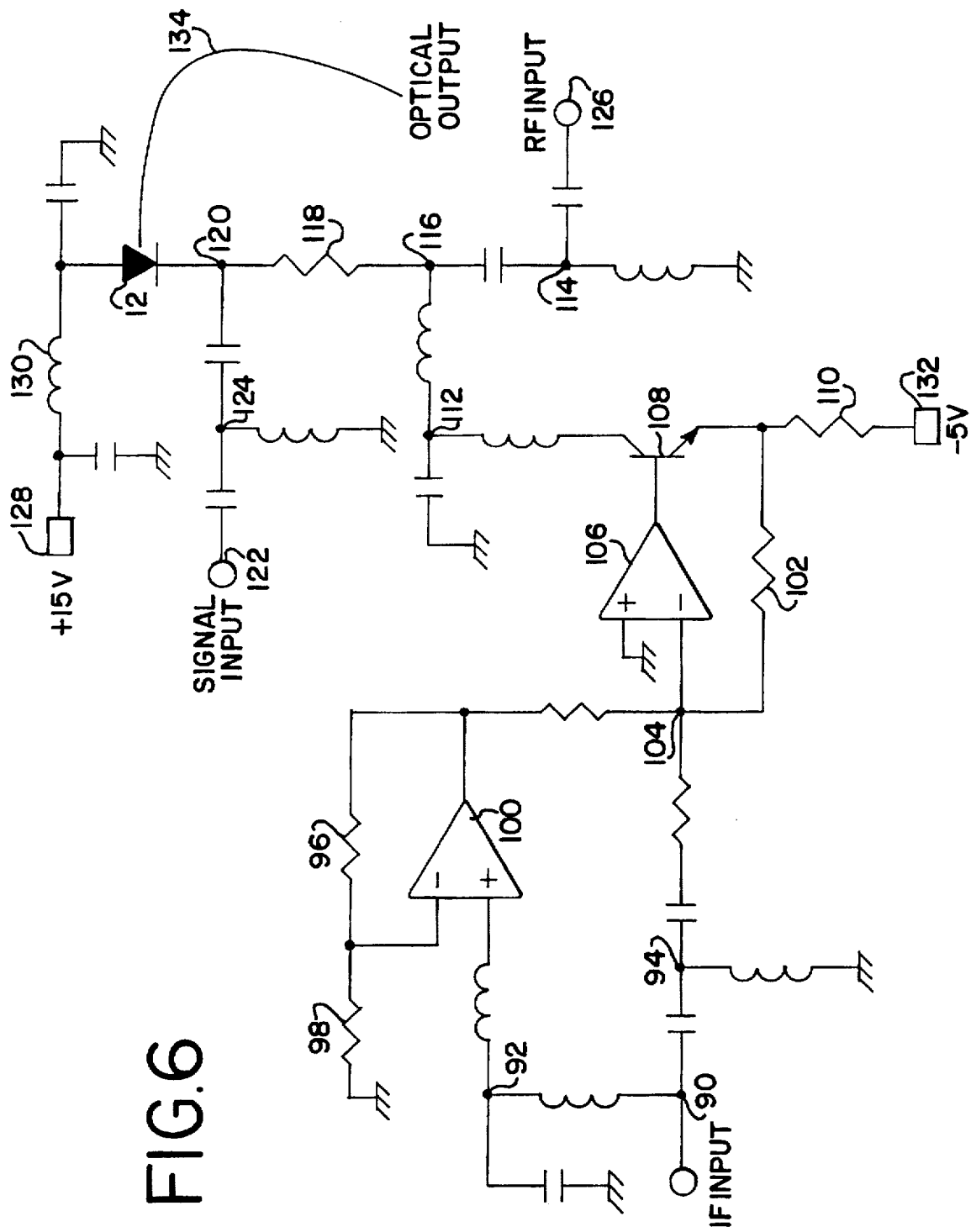
FIG. 6 is a schematic diagram of the IF amplifier 14 section of the servo loop including the interface to the laser through the impedance matching network of the combiner 32 of the transceiver of FIG. 1.

The IF amplifier 14 processes an error signal from the phase detector 28 and provides the interface of the feedback system to the laser 12. A schematic diagram depicting an embodiment of the IF amplifier and combinet sections of the laser drive circuit is shown in FIG. 6. In the embodiment the IF output of phase detector 28 is applied to the IF input 90. A high pass section of a diplexing filter filters a high frequency component from the detected phase of the heterodyne beat note and accommodates feedforward of the high frequency component of the IF signal directly to the final stage of the IF amplifier through nodes 90, 94, 104. The final stage comprises a summing amplifier 106 using a clamping, current feedback op-amp 106 (e.g., Comlinear CLC 502). This feedforward technique allows IF bandwidth to be increased despite phase margin degradation due to additional stages of IF gain.

A low pass section accommodates lower Fourier frequency components of the IF signal where additional available phase margin enables the introduction of additional IF gain (i.e., scaling). In the embodiment depicted by FIG. 6 a single stage amplifier is used which incorporates a high gain, wide bandwidth op-amp 100 (e.g., Comlinear CLC 422 or CLC 401). The scaled output at the lower Fourier frequencies is combined with the high frequency components at the summing junction 104 of op-amp 106.

The IF signal (i.e., the high frequency component and scaled detected phase of the heterodyne beat note) drives the laser junction current through op-amp 106 in combination with emitter follower transistor 108. The current is set by the input voltage to the op-amp at node 104 which corresponds to the voltage across resistor 110. The collector of current source transistor 108 is impedance matched to the laser by the low pass section at node 112 of the combinet 32 circuitry. It is important to note that this impedance match must be maintained over a wide bandwidth which may need to include the entire gain bandwidth of op-amp 106.

The combinet 32 (FIG. 6) functions as a multiplexing filter which comprises a low pass section 112 (e.g., DC-250 MHz) for the IF signal and a high pass section 114 (e.g., 0.25–4.0 GHz) to input couple the signal from RF oscillator 16 via directional coupler 30. In addition to combining signals from the RF oscillator 16 and IF amplifier 14, the combiner 32 includes a signal input port of a broadband high pass character (e.g., 0.01–2.0 GHz). In the embodiment both the laser 12 and resistor 118 are included in the matched load driven by diplexer output node 116, but only the laser is included in the matched load corresponding to the signal input 122. Thus it is possible to combine signals in a non-interfering manner in an area of overlapping frequency response. The high pass filter 124 couples the communications signal to the laser 12, and the low pass section 112 of diplexer 116 couples the IF feedback signal to the laser 12. All of the aforementioned signals may thus be combined and subsequently modulate the laser 12 without degradation of laser performance due to the contribution of any respective source. The modulated optical output is coupled into optical fiber 134 which thus contains the optical output of the coherent laser transmitter.

The function of the semiconductor laser (slave) 36 is as a local oscillator in a coherent homodyne or heterodyne optical receiver. The servo system which controls the semiconductor laser (slave) 36 is virtually identical to that which controls the transmitter laser 12 with the major exception that the local oscillator laser 36 does not utilize an optical resonator 20 for the derivation of the RF error signal in the heterodyne optical mixing spectrum. Furthermore, the frequency of RF oscillator 40 must be separated from that of the RF oscillator 16 by at least two times the full IF bandwidth of the servo. This ensures an adequate allocation of error signals between the master and slave lasers, respectively. The reason that the local oscillator servo for laser 36 does not require an optical resonator is because the residual laser transmitter power provides the same function for the servo which controls local oscillator laser 36 as the optical resonator leakage signal provides for that of the transmitter laser 12. Thus the embodiment enables the local oscillator laser to be locked directly to the transmitter center frequency which results in a robust homodyne detection of a coherent optical signal. It is also possible to achieve a heterodyne lock with this system wherein the local oscillator laser 36 is locked to the center frequency of the transmitter laser 12 with a slight phase offset error.

It is generally accepted that feedback control systems can be used to suppress intrinsic phase noise by feedback action by providing that the feedback loop system exhibit gain at frequencies which exceed the highest frequency Fourier component at which the phase noise must be compensated. Thus it follows that in order to narrow the linewidth of a laser source, the gain bandwidth of the servo loop must exceed the laser linewidth; i.e., the loop must have gain at the highest Fourier frequency of phase noise. Notwithstanding closed loop stability requirements determine the maximum group delay which can be tolerated before the high Fourier components of the feedback signal will make the loop unstable. Thus there is in fact a maximum gain which can be achieved within an acceptable phase margin for a given loop bandwidth.

In the case of the semiconductor laser however the case is not quite that simple. The laser functions as source, modulator and actuator in the feedback loop. Since the laser functions as the servo actuator it is in fact its own phase response to a modulation of junction current which determines the transfer characteristics of the loop. Because the dynamic range of the IF feedback signal controls the laser frequency over a considerable portion of the microwave spectrum it is possible for the loop to exhibit phase noise quieting of the laser at Fourier frequencies which exceed the frequency content of the IF spectrum of the servo loop.

In addition to performing several functions in the servo loop, the laser performs a dual function as source and modulator in this invention. It is that of the coherent transmission of a communications signal. Thus a single laser performs many critical functions in a complex system which results in an extremely cost effective approach to high performance coherent optical systems. When considering the considerable bandwidth and loss budget enhancements which are characteristic of the coherent optical technology, the utility of the invention described herein becomes clear.

I claim:

1. A method of frequency stabilizing a semiconductor laser comprising the steps of:
    detecting a heterodyne beat note by optically mixing a leakage field of an optical resonator and a frequency modulated output of the semiconductor laser;
    detecting a phase of the heterodyne beat note by mixing the heterodyne beat note in quadrature with a radio frequency reference signal;
    filtering the detected phase of the heterodyne beat note;
    scaling the detected phase of the heterodyne beat note; and
    modulating the semiconductor laser with the radio frequency reference signal and the scaled detected phase of the heterodyne beat note.

2. The method as in claim 1 further comprising the step of coupling an output of the semiconductor laser into the optical resonator.

3. The method as in claim 2 wherein the step of detecting a heterodyne beat note further comprises the step of diverting a portion of the output of the semiconductor laser into a photodetector.

4. The method as in claim 3 wherein the step of diverting a portion of the output of the semiconductor laser into the photodetector further comprises the step of intercepting a optical frequency reference signal from the optical resonator.

5. The method as in claim 1 wherein the step of detecting a heterodyne beat note further comprises the step of diverting a portion of an output of the optical resonator into the photodetector.

6. The method as in claim 1 wherein the step of filtering the detected phase of the heterodyne beat note further comprises the step of isolating at least one Fourier frequency component in a vicinity of a center frequency of the semiconductor laser.

7. The method as in claim 1 wherein the step of scaling the detected phase of the heterodyne beat note further comprises the step of amplifying the detected phase of the heterodyne beat note.

8. The method as in claim 1 wherein the step of modulating the semiconductor laser with the high frequency component and scaled detected phase of the heterodyne beat note further comprises the step of summing the isolated Fourier component of the scaled detected phase of the heterodyne beat note at an input of a current amplifier operably interconnected with the semiconductor laser.

9. The method as in claim 8 further comprising the step of impedance matching an output of the current amplifier to the semiconductor laser.

10. A method of frequency stabilizing a semiconductor laser comprising the steps of:
    detecting a heterodyne beat note in a photodiode by optically mixing a leakage field of an optical resonator and a frequency modulated output of the semiconductor laser;
    detecting a phase of the heterodyne beat note by mixing the heterodyne beat note in quadrature with a radio frequency modulation reference signal;
    separating a high Fourier frequency component signal from a low Fourier frequency component signal of the detected phase of the heterodyne beat note by bandwidth filtering;
    independently scaling the high Fourier frequency component signal and low frequency Fourier component signal of the detected phase of the heterodyne beat note; and modulating the semiconductor laser with the scaled high and low Fourier frequency component signals of the detected phase of the heterodyne beat note and with the radio frequency modulation source.

11. The method as in claim 10 further comprising the step of amplifying the detected heterodyne beat note before detecting a phase of the heterodyne beat note.

12. The method as in claim 10 wherein the step of scaling the high and low Fourier frequency component signals of the detected phase of the heterodyne beat note further comprises the step of amplifying the detected phase of the heterodyne beat note.

13. A method of frequency stabilizing a semiconductor laser comprising the steps of:

detecting a heterodyne beat note by optically mixing a leakage field of an optical resonator and a frequency modulated output of the semiconductor laser;

detecting a phase of the heterodyne beat note by mixing the heterodyne beat note in quadrature with a radio frequency reference signal to produce a difference frequency and frequency modulating the semiconductor laser with the difference frequency.

14. The method as in claim 13 further comprising the step of frequency modulating the semiconductor laser with the radio frequency reference signal.

* * * * *